(12) United States Patent
Muehlenstaedt et al.

(10) Patent No.: US 12,019,449 B2
(45) Date of Patent: Jun. 25, 2024

(54) RARE EVENT SIMULATION IN AUTONOMOUS VEHICLE MOTION PLANNING

(71) Applicant: Argo AI, LLC, Pittsburgh, PA (US)

(72) Inventors: Thomas Muehlenstaedt, Bavaria (DE); Vincent Aravantinos, Bavaria (DE)

(73) Assignee: Argo AI, LLC, Pittsburgh, PA (US)

( * ) Notice: Subject to any disclaimer, the term of this patent is extended or adjusted under 35 U.S.C. 154(b) by 706 days.

(21) Appl. No.: 17/178,333

(22) Filed: Feb. 18, 2021

(65) Prior Publication Data

US 2022/0261519 A1 Aug. 18, 2022

(51) Int. Cl.
  G05D 1/00 (2024.01)
  G06F 30/15 (2020.01)
  G06F 30/20 (2020.01)

(52) U.S. Cl.
  CPC ......... *G05D 1/0221* (2013.01); *G05D 1/0214* (2013.01); *G06F 30/15* (2020.01); *G06F 30/20* (2020.01)

(58) Field of Classification Search
  CPC ....... G06F 30/27; G06F 30/20; G05D 1/0214; G05D 1/0221
  USPC .......................................................... 703/8
  See application file for complete search history.

(56) References Cited

U.S. PATENT DOCUMENTS

| | | | |
|---|---|---|---|
| 7,693,624 | B2 | 4/2010 | Duggan et al. |
| 9,612,123 | B1 | 4/2017 | Levinson et al. |
| 9,836,895 | B1* | 12/2017 | Nygaard .............. G05D 1/0088 |
| 10,002,471 | B2 | 6/2018 | Blayvas et al. |
| 10,019,011 | B1 | 7/2018 | Green et al. |
| 10,031,526 | B1 | 7/2018 | Li et al. |
| 10,156,848 | B1 | 12/2018 | Konrardy et al. |

(Continued)

FOREIGN PATENT DOCUMENTS

| | | |
|---|---|---|
| CA | 3052234 A1 | 8/2018 |
| CN | 108292474 A | 7/2018 |

(Continued)

OTHER PUBLICATIONS

Van der Made, R. et al., "Automated Generation of Virtual Driving Scenarios from Test Drive Data", 24th International Technical Conference on the enhanced Safety of Vehicles (ESV), Jun. 8, 2015-Jun. 11, 2015.

(Continued)

*Primary Examiner* — John E Johansen
(74) *Attorney, Agent, or Firm* — Fox Rothschild LLP

(57) ABSTRACT

Methods of identifying corner case simulation scenarios that are used to train an autonomous vehicle motion planning model are disclosed. A system selects a scene that includes data captured by one or more vehicles over a time period. The data includes one or more actors that the vehicle's sensors perceived over the time period in a real-world environment. The system selects a scene that includes a safety threshold violation, and it identifies the trajectory of an actor that participated in the violation. The system generates simulated scenes that alter the trajectory of the actor in the selected scene, selects simulated scenes that are more likely to occur in the real world and that may include safety threshold violations that go beyond any that may be found in the original scene, and uses the selected simulated scenes to train an autonomous vehicle motion planning model.

22 Claims, 6 Drawing Sheets

(56) References Cited

U.S. PATENT DOCUMENTS

| | | | |
|---|---|---|---|
| 10,395,433 B2 | 8/2019 | Tomatsu | |
| 10,453,260 B2 | 10/2019 | Alaniz et al. | |
| 10,482,003 B1* | 11/2019 | Bondor | G06F 30/15 |
| 10,852,721 B1* | 12/2020 | Smith | G05D 1/0022 |
| 11,409,304 B1 | 8/2022 | Cai et al. | |
| 2005/0209983 A1 | 9/2005 | MacPherson | |
| 2008/0040004 A1 | 2/2008 | Breed | |
| 2008/0040029 A1 | 2/2008 | Breed | |
| 2010/0115411 A1 | 5/2010 | Sorokin et al. | |
| 2011/0167574 A1 | 7/2011 | Stout et al. | |
| 2011/0305183 A1 | 12/2011 | Hsu et al. | |
| 2014/0289174 A1 | 9/2014 | Statnikov et al. | |
| 2014/0309789 A1 | 10/2014 | Ricci | |
| 2016/0314224 A1 | 10/2016 | Wei et al. | |
| 2017/0113664 A1 | 4/2017 | Nix | |
| 2017/0267233 A1 | 9/2017 | Minster et al. | |
| 2018/0107770 A1 | 4/2018 | Cahoon et al. | |
| 2018/0188727 A1 | 7/2018 | Zhuang et al. | |
| 2018/0365888 A1 | 12/2018 | Satzoda et al. | |
| 2019/0004528 A1 | 1/2019 | Zhan et al. | |
| 2019/0228118 A1 | 7/2019 | Hummelshoj | |
| 2019/0250622 A1 | 8/2019 | Nister et al. | |
| 2019/0301886 A1 | 10/2019 | Elangovan et al. | |
| 2019/0354643 A1 | 11/2019 | Shum et al. | |
| 2019/0377351 A1 | 12/2019 | Phillips et al. | |
| 2020/0050536 A1 | 2/2020 | Nygaard et al. | |
| 2020/0082248 A1 | 3/2020 | Villegas et al. | |
| 2020/0192391 A1 | 6/2020 | Vora et al. | |
| 2020/0209874 A1* | 7/2020 | Chen | G06V 20/56 |
| 2020/0218979 A1 | 7/2020 | Kwon et al. | |
| 2020/0226225 A1 | 7/2020 | Zaytsev et al. | |
| 2020/0283016 A1 | 9/2020 | Blaiotta | |
| 2020/0284883 A1 | 9/2020 | Ferreira et al. | |
| 2020/0309561 A1 | 10/2020 | Li et al. | |
| 2020/0331493 A1 | 10/2020 | Wu | |
| 2020/0341466 A1 | 10/2020 | Pham et al. | |
| 2020/0409369 A1 | 12/2020 | Zaytsev et al. | |
| 2020/0410062 A1* | 12/2020 | O'Malley | G06F 30/20 |
| 2021/0053563 A1 | 2/2021 | Li et al. | |
| 2021/0096566 A1 | 4/2021 | Wang et al. | |
| 2021/0108936 A1 | 4/2021 | Seegmiller et al. | |
| 2021/0132604 A1 | 5/2021 | Gillett | |
| 2021/0263524 A1 | 8/2021 | Ackenhausen et al. | |
| 2021/0294944 A1 | 9/2021 | Nassar et al. | |
| 2021/0309248 A1 | 10/2021 | Choe et al. | |
| 2021/0350046 A1 | 11/2021 | Bosson et al. | |
| 2022/0119006 A1 | 4/2022 | Ariyaratne et al. | |

FOREIGN PATENT DOCUMENTS

| | | |
|---|---|---|
| CN | 109863533 A | 6/2019 |
| CN | 111406278 A | 7/2020 |
| WO | 2015173903 A1 | 11/2015 |
| WO | 20180204544 A1 | 11/2018 |

OTHER PUBLICATIONS

Rocklage, E. et al., "Automated Scenario Generation for Regression Testing of Autonomous Vehicles", 2017 IEEE 20th International Conference on Intelligent Transportation Systems (ISC): Workshop.

Guldogus, M., "Proof of Concept of Closed Loop Re-Simulation (CLR) Methods in Verification of Autonomous Vehicles", KTH Schoold of Electrical Engineering (EES), Master's Thesis, 2017.

Markkula, G., "Driver behavior models for evaluating automotive active safety", Department of Applied Mechanics, Chalmers University of Technology, Goteborg, Sweden 2015.

NVIDIA Self-Driving Safety Report, 2018.

Coelingh, E. et al., "Creating Driving Tests for Self-Driving Cars," IEEE Spectrum, Feb. 2018.

Liu, H. et al, "Real World Meets Virtual World: Augmented Reality Makes Driverless Vehicle Testing Faster, Safer and Cheaper," University of Michigan, pp. 1-8, Nov. 2018.

Stackpole, B. "Mcity Adds Augmented Reality to Driverless Car Testing Roadmap," Digital Engineering 247, Dec. 2018.

Gonzalez, D. et al., "A Review of Motrion Planning Techniques for Automated Vehicles," IEEE Transactions on Intelligent , Transportation Systems, vol. 17, No. 4, pp. 1135-1145, Apr. 2016.

Yurtsever, E., et al., "A Survey of Autonomous Driving: Common Practices and Emerging Technologies," IEEE Access, vol. 8, [cs. RO], Apr. 2020.

Dai, Bin et al., Hybrid Sensing Data Fusion of Cooperative Perception for Autonomous Driving with Augmented Vehiclular Reality, IEEE Systems Journal, vol. 15, No. 1, Mar. 2021.

We Deliver the Promise of Autonomy, https://edge-case-research.com/products-services/, Oct. 14, 2020.

Bolte, J.A. et al. "Towards Corner Case Detection for Autonomous Driving," arXiv:1902.09184vs [cs:CV] Feb. 26, 2019.

Koopman, P. "Edge Cases and Autonomous Vehicle Safety," Edge Case Research, SSS 2019, Bristol, Feb. 7, 2019.

Beck, J. et al. "Rare-Event Simulation," Springer International Publishing Switzerland 2015 R. Ghanem et al. (eds.), Handbook of Uncertainty Quantification, DOI 10.1007/978-3-319-11259-6_24-1, pp. 1-26.

U.S. Appl. No. 17/074,807, filed Oct. 20, 2020, In-Vehicle Operation of Simulation Scenarios During Autonomous Vehicle Runs.

U.S. Appl. No. 16/797,103, filed Feb. 21, 2020, Systems and Methods for Generating Simulation Scenario Definitions for an Autonomous Vehicle System.

U.S. Appl. No. 16/797,109, filed Feb. 21, 2020, Play-Forward Planning and Control System for an Autonomous Vehicle.

* cited by examiner

RARE EVENT SIMULATION IN AUTONOMOUS VEHICLE MOTION PLANNING

BACKGROUND

Autonomous vehicles (AVs) use motion planning systems to make decisions about where and how to move in an environment. Motion planning systems rely on artificial intelligence models to analyze moving actors that the vehicle's sensors may perceive, make predictions about what those actors may do, and determine a course of action for the vehicle that takes the actor's likely action into account.

To make predictions and determine courses of actions, the vehicle's motion planning model must be trained on data that the vehicle may encounter in an environment. The more scenarios that are used to train a vehicle's motion planning model, the better that the model can make motion planning decisions. However, the range of possible scenarios that a vehicle may encounter is limitless, and it is not possible for a vehicle to be pre-trained to recognize and handle every possible situation that it may encounter in the real world.

For example, some events may occur so infrequently that it is unlikely that a vehicle's perception system would capture such an event. If an event is not captured, the event will not be input to the vehicle's motion planning model for training. Such "edge events" or "corner cases" may include situations in which an actor commits a traffic violation, or in which an actor deviates from expected behavior (such as when a vehicle slips while traveling on an icy road). It is desirable to train the vehicle's motion planning model on corner cases so that the vehicle can learn how to react to them, but it is neither efficient nor practical to train the model on every possible corner case, especially those that are extremely unlikely to happen. Therefore, methods of identifying and developing an effective set of relatively more realistic and likely corner cases, and training the vehicle's model on such corner cases, is needed.

This document describes methods and systems that address issues such as those discussed above.

SUMMARY

Systems and methods for identifying corner case simulation scenarios for an autonomous vehicle are disclosed. The system includes a data store containing various scenes. Each scene includes perception data corresponding to one or more actors as perceived over a time window by an autonomous vehicle perception system during a run of an autonomous vehicle during a time window in a real-world environment. Computing elements of the system will select, from the data store, a scene that includes a safety threshold violation. The system will identify, in the selected scene, a first actor that was a participant in the safety threshold violation. The system will identify a trajectory of the first actor over at least a portion of the time window of the actor's run. The system will generate a set of simulated scenes by generating simulated trajectories of the first actor in the selected scene. The system will then input one or more of the simulated scenes into an autonomous vehicle motion planning model to train an autonomous vehicle motion planning model.

Optionally, the system also may analyze the simulated trajectories of the first actor to identify any of the simulated trajectories that correspond to one or more safety threshold violations. The system also may identify a subset of the simulated scenes that include one or more of the safety threshold violations, and it may filter out simulated scenes that do not include any of the safety threshold violations. Then, when training the autonomous vehicle motion planning model, the system may do so with simulated scenes that include one or more of the safety threshold violation scenarios and not with any simulated scenes that were filtered out. Also optionally, when identifying a subset of the simulated scenes that include one or more of the safety threshold violations, the system may identify a subset of the simulated scenes that correspond to one or more identified extreme scenarios.

In some embodiments, when generating the simulated trajectories of the first actor in the selected scene the system may vary a time-indexed property of the first actor in the scene over the time window of the selected scene. For example, the system may apply a randomization function to randomly alter one or more of the following: a speed of the first actor, a direction of movement of the first actor, or a turn signal status of the first actor.

In some embodiments, the system may identify, in the selected scene, a second actor that was not a participant in the safety threshold violation. The system also may identify a trajectory of the second actor over the time window. Then, when generating the set of simulated scenes the system may generate simulated trajectories of the second actor in the selected scene.

Optionally, when selecting the scene that includes a safety threshold violation the system may select a scene with a near-collision scenario by accessing various candidate scenes and, for each of the candidate scenes, analyze movement of one or more objects on the scene to determine a time-indexed location of each object over the time window of the scenes. The system may then classify, as a near-collision scenario, any time segment during any of the candidate scenes in which an object came within a threshold time-to-collision from the vehicle whose perception system perceived the object.

Optionally, when selecting the scene that includes a safety threshold violation, the system may select a scene with a traffic law violation by accessing candidate scenes and, for each of the candidate scenes, analyze the simulated trajectories to identify any simulated trajectories that correspond to a traffic law violation by the first actor.

Optionally, when generating the simulated trajectories of the first actor in the selected scene, the system may introduce one or more disturbances into the selected scene, and then predict a trajectory that the first actor will take after each disturbance is introduced. For example, the system may add an occlusion into the selected scene, vary the size of one or more objects in the selected scene, or change a turn signal state on a vehicle in the selected scene.

Optionally, when identifying the first actor that was a participant in the safety threshold violation, the system also may determine that the first actor was relevant to one or more motion planning decisions of the autonomous vehicle by satisfying one or more of the following conditions when the first actor was a participant in the safety threshold violation: (a) the first actor was within a threshold distance from the autonomous vehicle; (b) the first actor was moving at or above a threshold speed; or (c) the first actor was moving in a direction that was toward the autonomous vehicle.

BRIEF DESCRIPTION OF THE DRAWINGS

FIG. 4A illustrates an example scene in which multiple actors are detected, while

DETAILED DESCRIPTION

Figure 1:
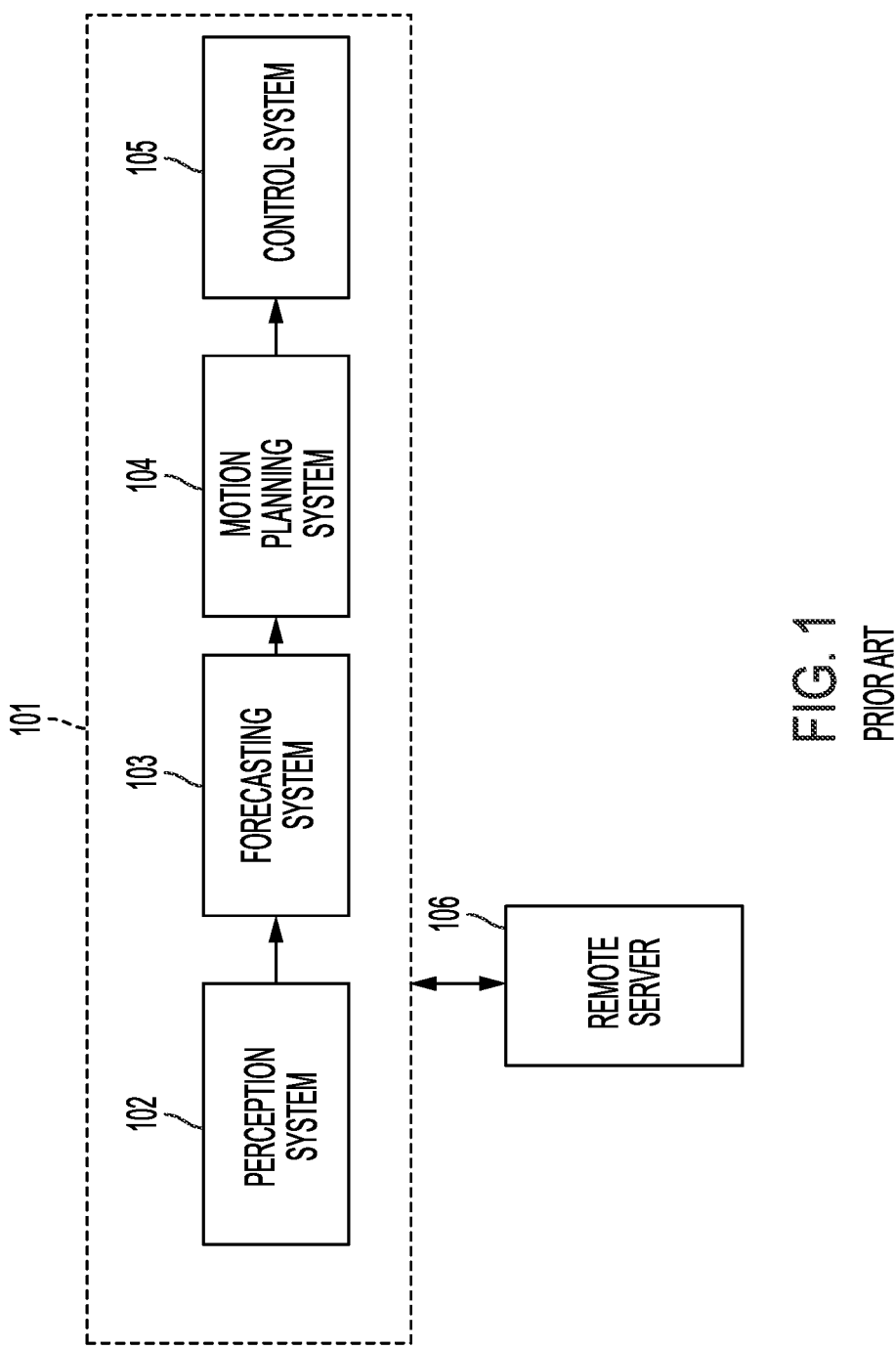
FIG. 1 illustrates example subsystems of an autonomous vehicle.

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to." Definitions for additional terms that are relevant to this document are included at the end of this detailed description.

This document describes methods for developing simulated scenarios of potential real-world events that an autonomous vehicle (AV) may encounter when driving in a real-world environment. The identified simulations focus on rare events, which are sometimes called "corner cases" or "edge event", that the vehicle is unlikely to encounter but which are still realistic enough that the vehicle could encounter them.

Before describing the details of this disclosure's corner case simulation processes, it is useful to provide some background information about autonomous vehicle (AV) systems. Certain components of the subsystems may be embodied in processor hardware and computer-readable programming instructions that are part of the AV's on-board computing system 101. The subsystems may include a perception system 102 that includes sensors that capture information about moving actors and other objects that exist in the vehicle's immediate surroundings. Example sensors include cameras, light detection and ranging (LiDAR) system sensors and radar sensors. The data captured by such sensors (such as digital image, LiDAR point cloud data, or radar data) is known as perception data.

The perception system may include one or more processors, and computer-readable memory with programming instructions and/or trained artificial intelligence models that, during a run of the AV, will process the perception data to identify objects and assign categorical labels and unique identifiers to each object detected in a scene. Categorical labels may include categories such as vehicle, bicyclist, pedestrian, building, and the like. Methods of identifying objects and assigning categorical labels to objects are well known in the art, and any suitable classification process may be used, such as those that make bounding box predictions for detected objects in a scene and use convolutional neural networks or other computer vision models. Some such processes are described in "Yurtsever et al., A Survey of Autonomous Driving: Common Practices and Emerging Technologies" (arXiv Apr. 2, 2020).

The vehicle's perception system 102 may deliver perception data to the vehicle's forecasting system 103. The forecasting system (which also may be referred to as a prediction system) will include processors and computer-readable programming instructions that are configured to process data received from the perception system and forecast actions of other actors that the perception system detects.

The vehicle's perception system, as well as the vehicle's forecasting system, will deliver data and information to the vehicle's motion planning system 104 and control system 104 so that the receiving systems may assess such data and initiate any number of reactive motions to such data. The motion planning system 103 and control system 104 include and/or share one or more processors and computer-readable programming instructions that are configured to process data received from the other systems, determine a trajectory for the vehicle, and output commands to vehicle hardware to move the vehicle according to the determined trajectory. Example actions that such commands may cause include causing the vehicle's brake control system to actuate, causing the vehicle's acceleration control subsystem to increase speed of the vehicle, or causing the vehicle's steering control subsystem to turn the vehicle. Various motion planning techniques are well known, for example as described in Gonzalez et al., "A Review of Motion Planning Techniques for Automated Vehicles," published in *IEEE Transactions on Intelligent Transportation Systems*, vol. 17, no. 4 (April 2016).

During deployment of the AV, the AV receives perception data from one or more sensors of the AV's perception system. The perception data may include data representative of one or more objects in the environment. The perception system will process the data to identify objects and assign categorical labels and unique identifiers to each object detected in a scene.

Figure 2:
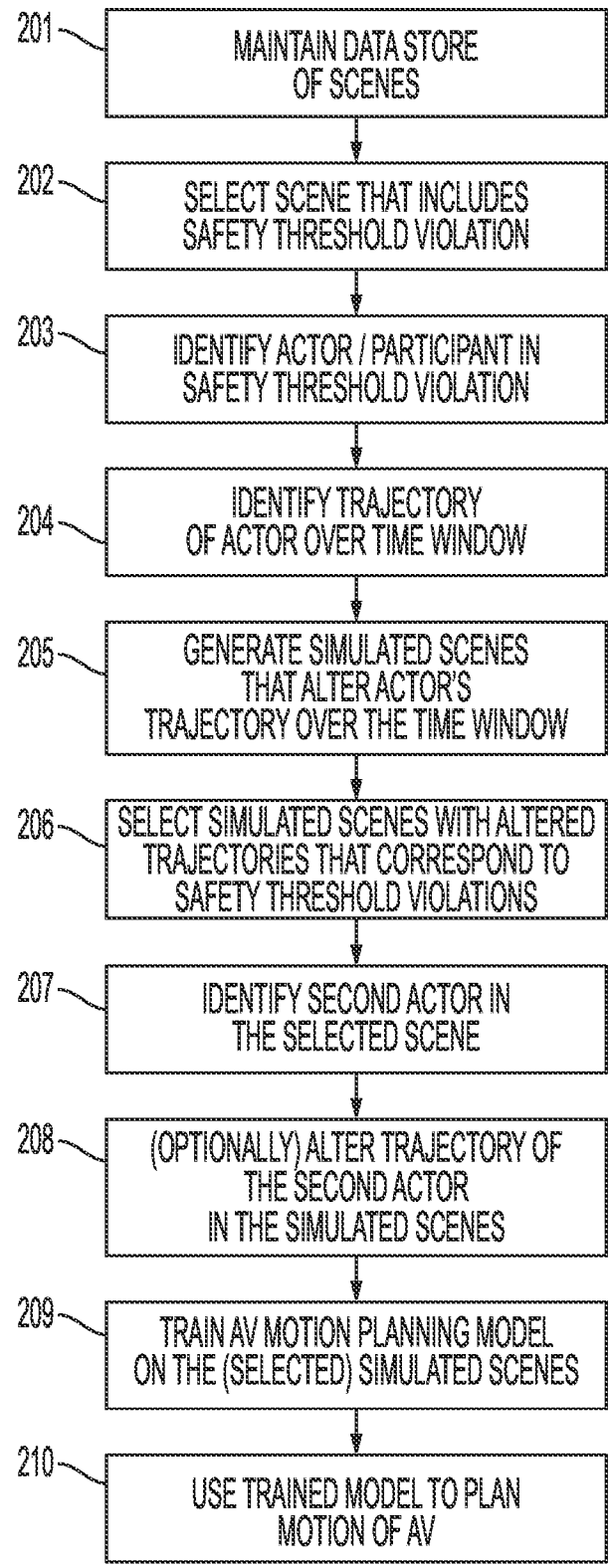
FIG. 2 illustrates an example process of identifying corner case simulation scenarios for an autonomous vehicle.

FIG. 2 illustrates an example process for generating a realistic set of corner case simulations that may be used to train an AV's motion planning model. A system that is onboard the AV, or a remote server having data that may be transferred to the AV, will maintain a data store with a set of scenes (step 201). Each scene includes a set of perception data captured by sensors of one or more AVs during one or more runs in a real-world environment over a time window. The scene data may include data collected by AV cameras, LiDAR system sensors and/or other perception system components. The scene data may include labels for moving actors, stationary or both objects detected in each scene, such as "traffic light," "pedestrian," "bicycle," "truck" or other classifications. Each scene may be time-indexed over a time window so that the trajectory of any moving actor can be tracked over the time window, and the location of stationary objects can be tracked as the AV moves through the environment over the time window.

At 202 a processor will access the data store and select a scene that includes a safety threshold violation, and at 203 the processor will identify the actor that participated in the safety threshold violation. A safety threshold violation is a condition in which another vehicle, a pedestrian or other actor in the scene either (a) moved in a manner that violated a traffic regulation (such as a vehicle running through a red light or stop sign without stopping, a vehicle making an illegal turn, or a pedestrian jaywalking); or (b) moved within a near-collision threshold distance of the AV, and/or caused the AV to alter its trajectory to avoid a collision. The scenes may be pre-labeled as having near-collision events or other safety violations, and the actors involved in the actions also may be pre-labeled, in which case at 202 the system may search the data store for scenes that are tagged with such a label. Alternatively, the system may process the scenes to automatically identify those scenes having near-collision events, such as scenes in which an actor moves to a position that is less than a safety threshold safety distance from the AV. For example, the system may examine the scene data to search for any actor that came within a threshold distance from the AV, any actor that moved at or above a threshold speed, any actor that was moving toward the vehicle, or any actor who meets a combination of these and other criteria. To process the scenes, the system may measure (in the perception data) the distance from the AV to a LiDAR bounding box of the actor. If the closest corner of the bounding box is within a threshold safety distance from the AV, this may indicate a near-collision event, or it may be one factor to be analyzed with other factors (such as speeds and directions of the AV and the actor) to determine whether a near-collision event exists. Other analysis methods are possible.

Depending on the scene data, some actors may have more than one label, or an actor may be identified as ambiguous or unclassifiable. For example, a pedestrian who is carrying a bicycle may be labeled as a pedestrian, a cyclist or both pedestrian and cyclist with a relative confidence value assigned to each category. If so, then the system may process the actor according to both categories, or according to the category having the higher confidence value.

The processor that identifies the actor and the safety threshold violation in steps 202 and 203, as well as the processor that performs the additional steps described below, may be that of a computing device that is onboard the AV, part of an offboard or otherwise remote server having data that may be transferred to or received from the AV, or a combination of the two.

Once the safety threshold violation and actor are identified, at 204 the system will process the scene data to determine a trajectory of the actor over at least a portion of the scene's time window that leads up to the time of the safety threshold violation. The system may use any suitable trajectory-determining algorithm for doing this. For example, the system may use rare event simulation algorithm or a subset sampling algorithm. Other suitable algorithms are known, for example as disclosed in Beck and Zuev, "Rare-Event Simulation", published in *Handbook of Uncertainty Quantification* (2015). The system may also compare the scene data to a set of map data to identify one or more road lanes or lane segments that are in the scene, as well as reference polylines representing a direction of motion for each lane or lane segment. The system may then record the actor's position relative to one or more of the reference polylines over a portion of the time window leading up to the safety threshold violation, The trajectory will define a time-indexed path that the actor followed before the safety threshold violation occurred, in which the actor's coordinates (i.e., the distance and angle from the reference path) are recorded at each of various points of time over at least part of the time window.

Figure 3A:
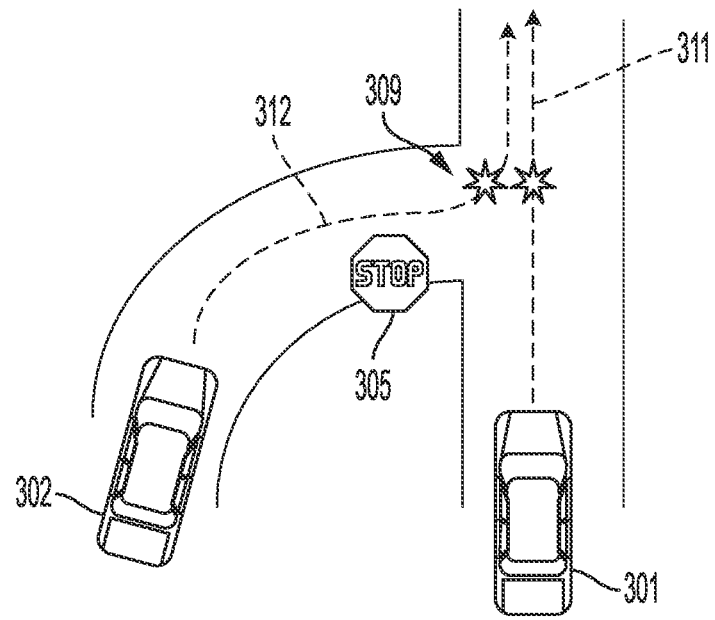
FIG. 3A illustrates an example trajectory of an actor in a scene that includes a safety threshold violation.

An example of the data that a scene may include is illustrated in FIG. 3A, in which an AV 301 is moving in a first lane along a first planned trajectory 311. Another actor 302 is moving in a lane that intersects the lane of the actor along a second trajectory 312. In this situation, the other actor 302 fails to stop at a stop sign 305. This failure creates a safety threshold violation when the actor comes less than a specified safety threshold distance away from the AV at 309.

Returning to FIG. 2, at 205 the system will then generate simulated variants of the scene containing the safety threshold violation by generating a copy of the scene data but varying the actor's trajectory over the time window. Variation of the actor's trajectory will include altering one or more parameters describing the actor over time, such as the such as the actor's trajectory, speed, direction of motion, starting times, other features, or combinations of these. This variation may occur at one or more points over the time window. For example, to vary the trajectory, the system may apply a randomization function to any of these parameters at any point within the time window to alter the parameter's value. If this happens, the system may apply one or more constraints on the randomization function so that the alternate trajectory is consistent with real-world expectations. For example, a constraint may require that the actor's speed not vary to cause more than a threshold level of acceleration of deceleration, or a constraint may require that the actor not deviate from its path by more than a threshold angle. If a randomization result violates any of these constraints, the system may re-run the randomization function until it yields a result that satisfies the constraints, or it may alter the parameter value that violated the constraint to be a value that is at or within the threshold of the constraint. Alternatively, instead of randomizing the trajectory parameters, the system may access a set of stored actor trajectories that correspond to the scene and randomly select one of the stored actor trajectories. The system will save the generated simulated scenes to a data store.

Figure 3B:
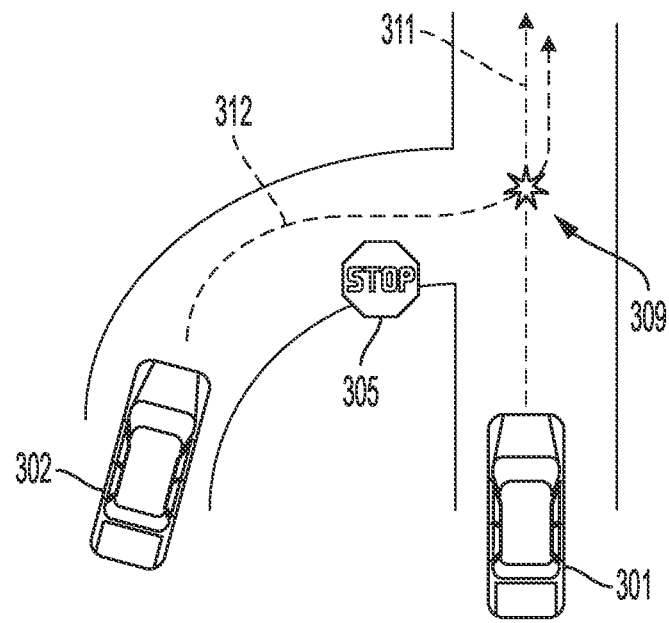
FIG. 3B illustrates an example altered trajectory in a simulated scene that is generated from the scene of FIG. 3A.

A resulting simulated scene is illustrated in FIG. 3B, which is a variant of FIG. 3A but in this case the trajectory 312 of actor 302 has been altered such that time-indexed locations of the actor 302 over time are changed to yield a trajectory 312 that crosses the planned trajectory 311 of the AV. This scene also includes a safety threshold violation at 309, and in this situation the violation is even more extreme in that the AV 301 and actor 302 would collide if each continued along its trajectory. In addition to time-indexed locations, other time-indexed properties of the actor may be varied over time, such as turn signal status.

In some embodiments, in step 205 rather than directly altering the trajectory of the actor in the simulated scene, the system may indirectly alter the actor's trajectory by introducing a disturbance into the scene. For example, the system may introduce a disturbance into the scene and then predict a trajectory of the actor in reaction to the disturbance. Examples of disturbances include, and are not limited to: (a) simulated animals, pedestrians or other actors positioned in a place that may interfere with the actor's trajectory; (b) occlusions that may interfere with the actor's line of sight to the AV; (c) variations in the size of other objects in the scene so that existing objects may occlude or interfere with the other actor; (d) changing the state of a turn signal on another vehicle in the scene, or any other disturbance. The system may then predict the actor's reactive trajectory using algorithms such as those discussed above in the context of FIG. 1.

At 206 the system will select, from the set of generated simulated scenes, one or more scenes that include a safety threshold violation. The selection may be done by outputting a user interface to a human evaluator who will add a safety threshold violation label to selected scenes, and recording the human-input labels in the data set with the corresponding simulated scenes. Alternatively, the system may process the simulated scenes to automatically identify those having safety threshold violations using processes such as those described above in step 202. Either way, at 206 the system will identify simulated scenes that include one or more safety threshold violations, filter out simulated scenes that do not include any safety threshold violations, and retain only those scenes that have one or more safety threshold violations for use in the next steps of the process. In some embodiments, at 206 the system may apply other parameters to select only those safety threshold violations that are associated with a designated extreme event scenario, such as those that deviate from a safety threshold by at least a minimum amount, or those that involve a collision.

Optionally, the system may filter the simulated scenes to select those having parameters that correspond a specified scenario, such as a collision or near-collision scenario. For example, in FIG. 3A, the safety threshold violation 309 of the actor 302 is failing to stop at the stop sign 302, which caused actor 302 to move close enough to AV 301 to be within a threshold time-to-collision with AV 301. In addition or alternatively, the system may identify and select those simulated scenes in which an actor's trajectory yielded a traffic law violation, such as exceeding a posted speed limit, failing to stop at a stop sign or red light, or making an illegal turn.

At 209 the system will input one or more of the simulated scenes that have a safety threshold violation into motion planning model. The simulated scenes used in this step will have labels identifying the actor, the actor's trajectory, and the violation. By processing the scenes to identify parameters of the scene that correlate to the violation, the model will be trained for real-time use by an AV in motion planning when making a run in a real-world environment.

At 210 an AV may then use the trained model to process real-world perception data and make motion planning decisions that define the AV's trajectory. For example, an AV that uses a model that has been trained on a simulated scene such as that of FIG. 3B may use the model process real-world data and identify conditions that suggest that a perceived actor may be about to run through a stop sign and will likely collide with the AV's planned trajectory. If so, the AV may alter its trajectory to slow down speed up, or swerve to avoid the collision.

Figure 4A:
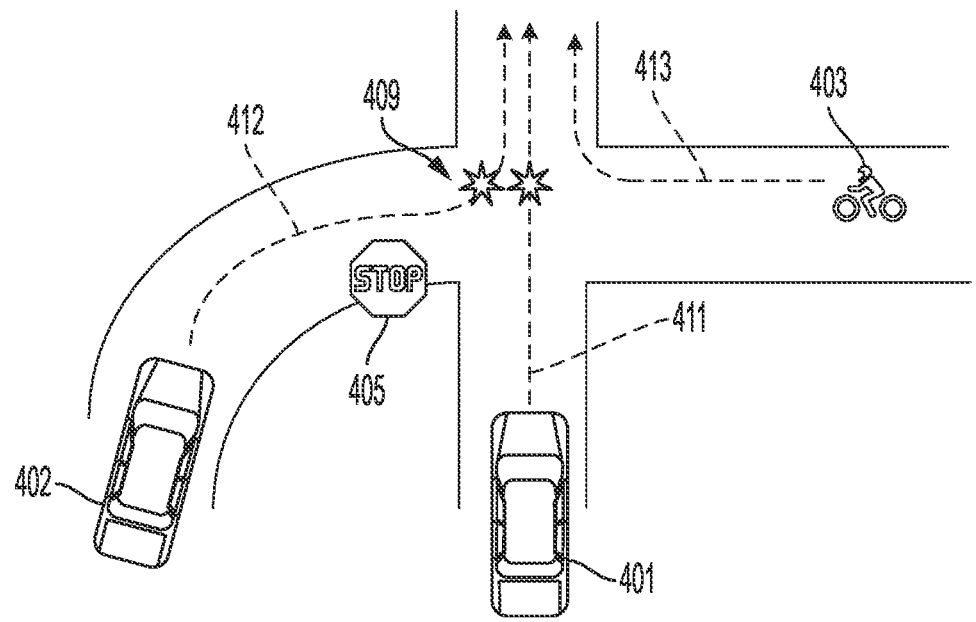
Figure 4B:
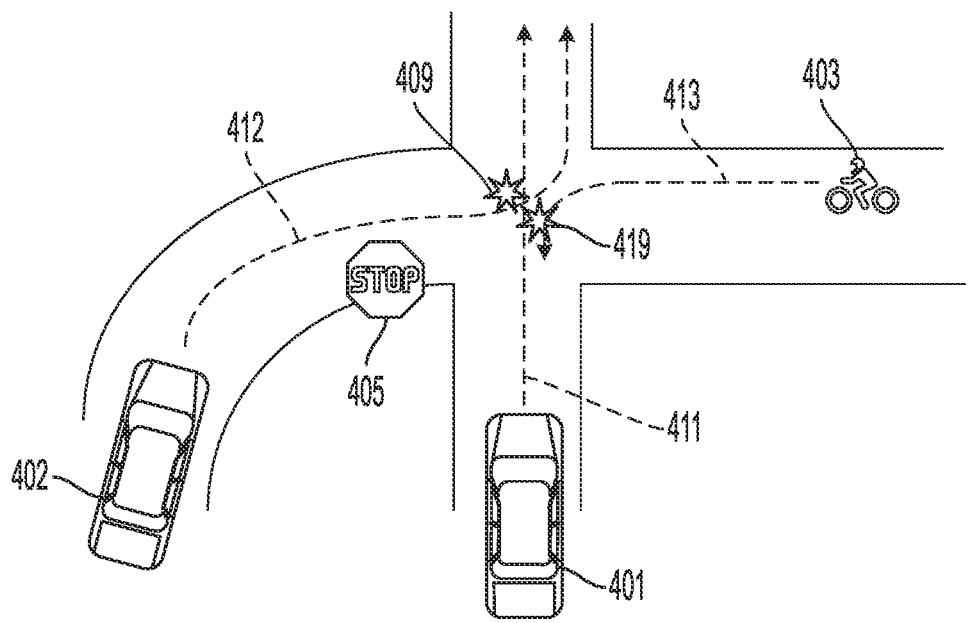
FIG. 4B illustrates an example simulated scene that is generated from that of FIG. 4A and in which the trajectories of multiple actors are varied.

Optionally, the simulated scene may alter actions of not only one actor, but also of multiple actors. For example, before training the AV's motion planning model on a simulated scene at 207 the system also may identify a second actor in the scene and a trajectory of the second actor. At 208 the system may alter the trajectory of the second actor in the simulated scene, using trajectory alteration methods such as those discussed above for the first actor in step 205. This is illustrated by way of example in FIG. 4A, in which an original scene includes an AV 401 following trajectory 411, a first actor 402 following trajectory 412, and a second actor 413 following trajectory 413. The first actor again fails to stop at the stop sign 405, creating a safety threshold violation at 409. FIG. 4B illustrates a simulated scene that various not only the trajectory 412 of actor 402 but also the trajectory 413 of the second actor 403. The altered trajectory 413 of the second actor 403 in FIG. 4B indicates that the second actor 403 has swerved to avoid collision with the first actor, but in doing so created a second safety threshold violation 419 by nearly missing collision with the AV 401.

Figure 5:
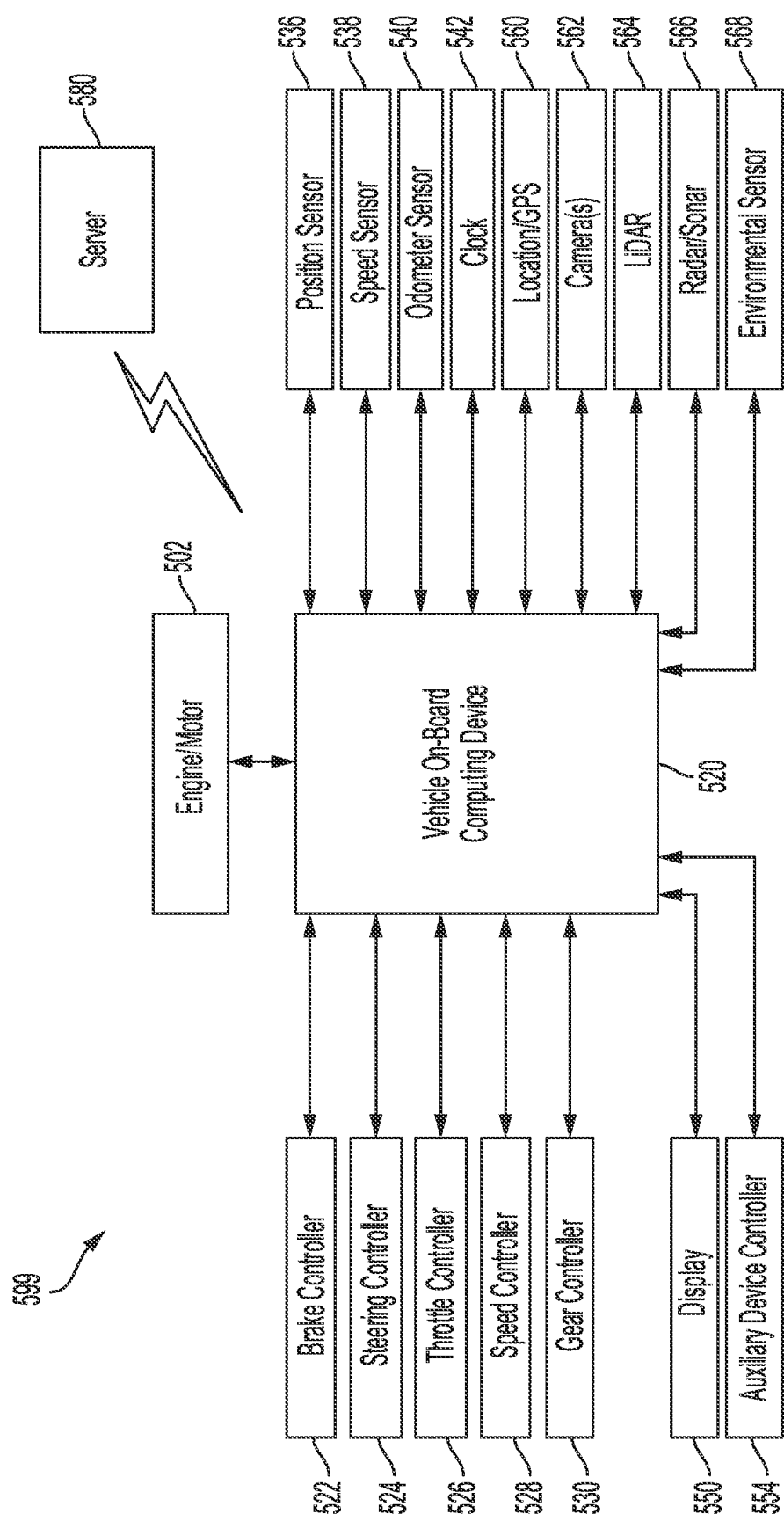
FIG. 5 illustrates example systems and components of an autonomous vehicle, with additional details of elements that may appear in the subsystems of FIG. 1.

FIG. 5 illustrates an example system architecture 599 for a vehicle, such as an AV. The vehicle includes an engine or motor 502 and various sensors for measuring various parameters of the vehicle and/or its environment. Operational parameter sensors that are common to both types of vehicles include, for example: a position sensor 536 such as an accelerometer, gyroscope and/or inertial measurement unit; a speed sensor 538; and an odometer sensor 540. The vehicle also may have a clock 542 that the system uses to determine vehicle time during operation. The clock 542 may be encoded into the vehicle on-board computing device, it may be a separate device, or multiple clocks may be available.

The vehicle also will include various sensors that operate to gather information about the environment in which the vehicle is traveling. These sensors may include, for example: a location sensor 560 such as a global positioning system (GPS) device; object detection sensors such as one or more cameras 562; a LiDAR sensor system 564; and/or a radar and or and/or a sonar system 566. The sensors also may include environmental sensors 568 such as a precipitation sensor and/or ambient temperature sensor. The object detection sensors may enable the vehicle to detect moving actors and stationary objects that are within a given distance range of the vehicle 599 in any direction, while the environmental sensors collect data about environmental conditions within the vehicle's area of travel. The system will also include one or more cameras 562 for capturing images of the environment. Any or all of these sensors, together with one or more processors of the vehicle's on-board computing device 520 and programming instructions that, when executed by the processors, enable the computing system to classify objects in the perception data, may be considered to be the vehicle's perception system.

During a run of the vehicle, information is communicated from the sensors to an on-board computing device 520. The on-board computing device 520 analyzes the data captured by the perception system sensors and, acting as a motion planning system, executes instructions to determine a trajectory for the vehicle. The trajectory includes pose and time parameters.

Operating as a control system with components that cause the vehicle to move, the vehicle's on-board computing device will control operations of various vehicle components to move the vehicle along the trajectory. For example, the on-board computing device 520 may control braking via a brake control subsystem 522; direction via a steering control subsystem 524; speed and acceleration via a throttle control subsystem 526 (in a gas-powered vehicle) or a motor speed controller 528 (such as a current level controller in an electric vehicle); a differential gear controller 530 (in vehicles with transmissions); and/or other controllers that make up the control system.

Geographic location information may be communicated from the location sensor 560 to the on-board computing device 520, which may then access a map of the environment that corresponds to the location information to determine known fixed features of the environment such as streets, buildings, stop signs and/or stop/go signals. Captured images from the cameras 562 and/or object detection information captured from sensors such as a LiDAR system 564 is communicated from those sensors) to the on-board computing device 520. The object detection information and/or captured images may be processed by the on-board computing device 520 to detect objects in proximity to the vehicle 599. In addition or alternatively, the AV may transmit any of the data to an external server for processing. Any known or to be known technique for making an object detection based on sensor data and/or captured images can be used in the embodiments disclosed in this document.

In the various embodiments discussed in this document, the description may state that the vehicle or on-board computing device of the vehicle may implement programming instructions that cause the on-board computing device of the vehicle to make decisions and use the decisions to control operations of one or more vehicle systems. However, the embodiments are not limited to this arrangement, as in various embodiments the analysis, decisionmaking and or operational control may be handled in full or in part by other computing devices 580 that are in electronic communication with the vehicle's on-board computing device. Examples of such other computing devices include an electronic device (such as a smartphone) associated with a person who is riding in the vehicle, as well as a remote server that is in electronic communication with the vehicle via a wireless communication network. The processor of any such device may perform the operations that will be discussed in this document.

In addition, the AV may include an onboard display device 550 that may generate and output interface on which sensor data, vehicle status information, or outputs generated by the processes described in this document are displayed to an occupant of the vehicle. The display device may include, or a separate device may be, an audio speaker that presents such information in audio format.

Figure 6:
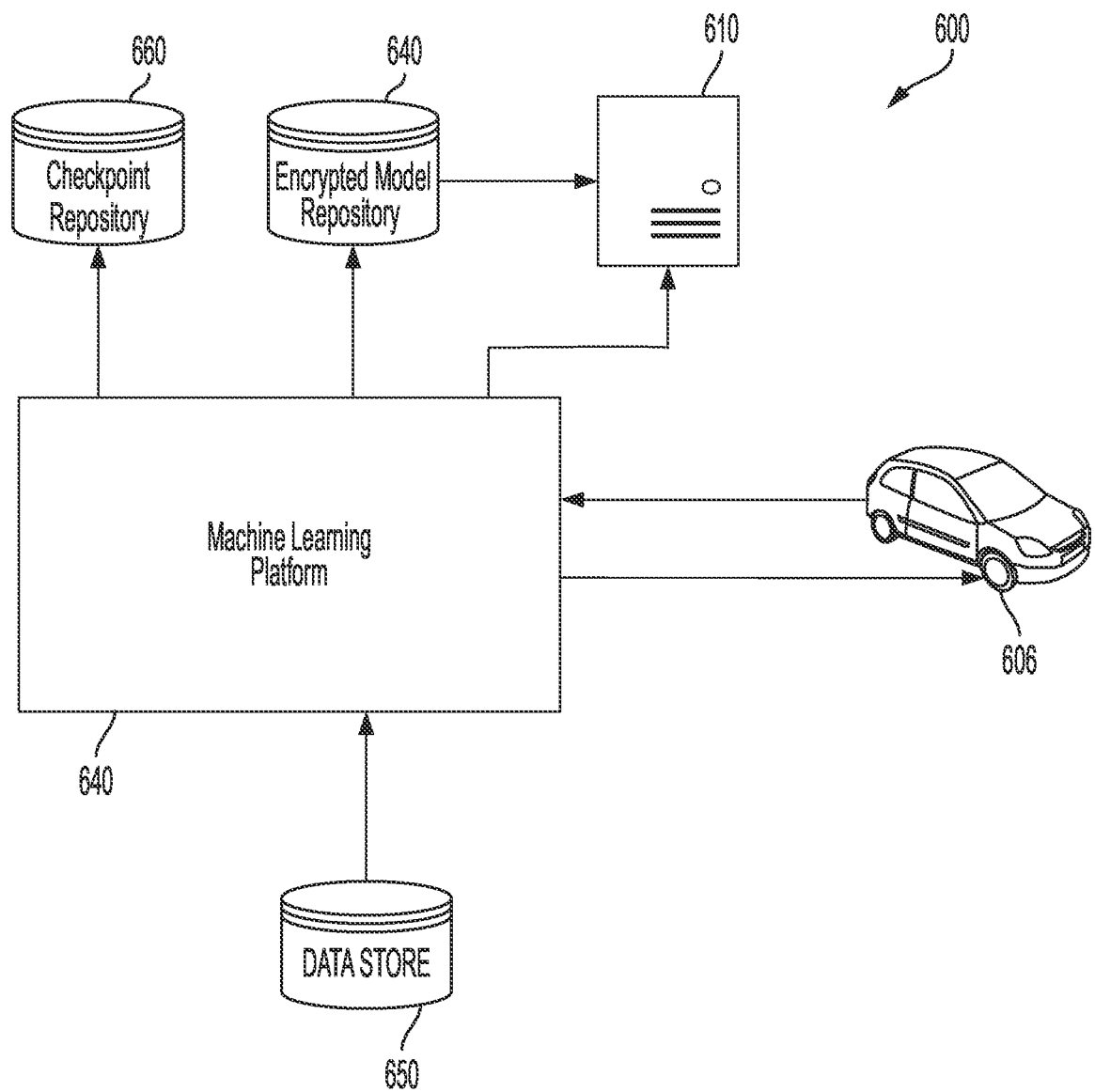
FIG. 6 is a block diagram illustrating a system for secure machine learning training is shown.

The discussion above refers to the concept of training a motion planning model on various simulation scenarios. Example methods by which training may occur will now be described. Referring now to FIG. 6, a block diagram illustrating a system 600 for secure machine learning training is shown. Various components of the system may communicate with each other over a communications network (not shown here) such as, without limitation, Internet, VPNs, Intranets, WAN, P2P networks, cellular networks, or other forms of network. Example protocols that can be leveraged for such communications include HTTP, HTTPS, SSL, SSH, TCP/IP, UDP/IP, FTP, SCP, WSDL, SOAP, or other types of well-known protocols. It should be appreciated that, although such protocols can be leveraged, it is contemplated that the data exchanged among the devices in the ecosystem/system will be further packaged for easy transport and consumption by the computing devices. The communications network may also implement protocols for secure communication such as an SSL (secure socket layer) or TLS layer (transport layer security) cryptographic protocol.

The system 600 includes a data store 650 that includes data types that can be used for training machine learning models such as, without limitation, 2D images, LiDAR sensor data, speech samples, audio samples, text samples, 3D images, location coordinates, or the like. Actual and simulated scenes that are generated as discussed above may be stored in this data store. Accordingly, the training data may be packaged into and/or associated with one or more simulation scenarios, representing actors and other objects that the vehicle may encounter in a real-world environment. Objects in the data will be labeled according to class (such as pedestrian, bicycle, truck, etc.) and other possible characteristics.

As shown in FIG. 6, the system also includes a secure machine learning platform 640 that receives labeled data from the data store 650, and enables one or more motion planning systems of a vehicle 606 to access the labeled data, as described below. The machine learning platform 640 may be a neural network or other model capable of processing data and assisting the AV's motion planning subsystem in making motion planning decisions for the AV. The machine learning platform 640 may be onboard the vehicle 606 that includes the motion planning system, or training may be done offboard with a trained model later being loaded to the vehicle 606.

A data ingestion module of the machine learning model 640 may receive labeled data and (if encrypted) decrypt it using a suitable protocol (e.g., using a decryption key). The data ingestion module may also divide the received training data into subsets such as, without limitation, training data, test data, and validation data for use in training a machine learning model, testing a trained model, and validating a trained model, respectively.

Data ingestion module may further divide the training data into clusters. Clusters may be formed based on, for example, random sampling, similarities between data units of a cluster, required characteristics of data for training a machine learning model at a training device (e.g., training a machine learning model to perform ground segmentation may require training data that includes a first number of ground images and a second number of non-ground images), required number of data units for training a machine learning model at a training device, access levels associated with a training device and/or a user of the vehicle or other training device, etc. The clustered training data may be transmitted to the corresponding training device for use in training a machine learning model for use by the motion planning system of the vehicle 606, or delivered to an offboard machine learning server 610 to generate or update a model that is later uploaded to the motion planning system of the vehicle 606. Optionally, a particular model may get access to only a subset of the training data depending upon the corresponding access level and training data requirements, and never to the complete training data set at a particular time. The vehicle 606 also return perception data to the machine leaning platform 640 for processing and/or training.

In some embodiments, the training system 600 may use training data to train one or more implementations of machine learning algorithms such as, without limitation, Google®'s Artificial Intelligence including TensorFlow™, OpenAI™, Prediction IO™, Shogun™, WEKA, or Mahout™, Matlab, Amazon's Machine Learning, Microsoft's Azure Machine Learning, and SciKit-Learn, or the like. A machine learning algorithm may include different types of algorithms including implementations of a classification algorithm, a neural network algorithm, a regression algorithm, a decision tree algorithm, a clustering algorithm, a genetic algorithm, a supervised learning algorithm, a semi-supervised learning algorithm, an unsupervised learning algorithm, a deep learning algorithm, or other types of algorithms. Each algorithm can include a wide variety of possible model instructions that define the conditions under which training occurs. For example, the conditions could include a number of iterations or epochs to execute on the training data, learning rates, convergence requirements, time limits for training, initial conditions, sensitivity, specificity or other types of conditions that are required or optional. Convergence requirements can include first order derivatives such as "rates of change", second order derivatives such as "acceleration", or higher order time derivatives or even higher order derivatives of other dimensions in the attribute space of the data, etc. A user of the training device may provide hyperparameters that define how training is to be performed for the machine learning algorithm. The hyperparameters may be revised based on evaluation metrics for updating a trained machine learning model and/or for fine tuning (discussed below).

In certain embodiments, the training system 600 can function within a secured virtual machine or secured container that is dedicated to specific programming tasks, which allows multiple, disparate users (e.g., developers) to work in parallel while also ensuring that each user's efforts remain secure from each other. For example, training system 600 can be implemented via a Docker® container, where each user would have a separate instance of their own training device running on a server. In other embodiments, the training device can be constructed to process many sessions in parallel, where each session can be implemented as separate threads within the operating system (e.g., Linux, Windows, etc.) of the server.

Terminology that is relevant to the disclosure provided above includes:

The term "vehicle" refers to any moving form of conveyance that is capable of carrying either one or more human occupants and/or cargo and is powered by any form of energy. The term "vehicle" includes, but is not limited to, cars, trucks, vans, trains, autonomous vehicles, aircraft, aerial drones and the like. An "autonomous vehicle" is a vehicle having a processor, programming instructions and drivetrain components that are controllable by the processor without requiring a human operator. An autonomous vehicle may be fully autonomous in that it does not require a human operator for most or all driving conditions and functions. Alternatively, it may be semi-autonomous in that a human operator may be required in certain conditions or for certain operations, or that a human operator may override the vehicle's autonomous system and may take control of the vehicle. Autonomous vehicles also include vehicles in which autonomous systems augment human operation of the vehicle, such as vehicles with driver-assisted steering, speed control, braking, parking and other advanced driver assistance systems.

A "run" of a vehicle refers to an act of operating a vehicle and causing the vehicle to move about the real world. A run may occur in public, uncontrolled environments such as city or suburban streets, highways, or open roads. A run may also occur in a controlled environment such as a test track.

The term "object," when referring to an object that is detected by a vehicle perception system or simulated by a simulation system, is intended to encompass both stationary objects and moving (or potentially moving) actors, except where specifically stated otherwise by terms use of the term "actor" or "stationary object."

The terms "memory," "memory device," "data store," "data storage facility" and the like each refer to a non-transitory device on which computer-readable data, programming instructions or both are stored. Except where specifically stated otherwise, the terms "memory," "memory device," "data store," "data storage facility" and the like are intended to include single device embodiments, embodiments in which multiple memory devices together or collectively store a set of data or instructions, as well as individual sectors within such devices.

The terms "processor" and "processing device" refer to a hardware component of an electronic device that is configured to execute programming instructions, such as a microprocessor or other logical circuit. A processor and memory may be elements of a microcontroller, custom configurable integrated circuit, programmable system-on-a-chip, or other electronic device that can be programmed to perform various functions. Except where specifically stated otherwise, the singular term "processor" or "processing device" is intended to include both single-processing device embodiments and embodiments in which multiple processing devices together or collectively perform a process.

A "machine learning model" or a "model" refers to a set of algorithmic routines and parameters that can predict an output(s) of a real-world process (e.g., prediction of an object trajectory, a diagnosis or treatment of a patient, a suitable recommendation based on a user search query, etc.) based on a set of input features, without being explicitly programmed. A structure of the software routines (e.g., number of subroutines and relation between them) and/or the values of the parameters can be determined in a training process, which can use actual results of the real-world process that is being modeled. Such systems or models are understood to be necessarily rooted in computer technology, and in fact, cannot be implemented or even exist in the absence of computing technology. While machine learning systems utilize various types of statistical analyses, machine learning systems are distinguished from statistical analyses by virtue of the ability to learn without explicit programming and being rooted in computer technology.

In this document, when relative terms of order such as "first" and "second" are used to modify a noun, such use is simply intended to distinguish one item from another, and is not intended to require a sequential order unless specifically stated.

The invention claimed is:

1. A method of identifying corner case simulation scenarios for an autonomous vehicle, the method comprising:
   by an autonomous vehicle motion planning system:
   maintaining a data store containing a plurality of scenes, in which each scene includes perception data corresponding to one or more actors as perceived over a time window by an autonomous vehicle perception system during a run of an autonomous vehicle during a time window in a real-world environment;
   selecting, from the data store, a scene that includes a safety threshold violation;
   identifying, in the selected scene, a first actor that was a participant in the safety threshold violation;
   identifying a trajectory of the first actor over at least a portion of the time window;
   generating a set of simulated scenes by generating simulated trajectories of the first actor in the selected scene; and
   inputting one or more of the simulated scenes into an autonomous vehicle motion planning model to train the autonomous vehicle motion planning model.

2. The method of claim 1, further comprising:
   analyzing the simulated trajectories of the first actor to identify any of the simulated trajectories that correspond to one or more safety threshold violations;
   identifying a subset of the simulated scenes that include one or more of the safety threshold violations;
   filtering out simulated scenes that do not include any of the safety threshold violations; and
   when training the autonomous vehicle motion planning model, doing so with simulated scenes that include one or more of the safety threshold violation scenarios and not with any simulated scenes that were filtered out.

3. The method of claim 2, wherein identifying a subset of the simulated scenes that include one or more of the safety threshold violations comprises identifying a subset of the simulated scenes that correspond to one or more identified extreme scenarios.

4. The method of claim 1, wherein generating the simulated trajectories of the first actor in the selected scene comprises varying a time-indexed property of the first actor in the scene over the time window of the selected scene.

5. The method of claim 4, wherein varying the time-indexed property of the first actor in the scene over the time window of the selected scene comprises applying a randomization function to randomly alter one or more of the following: a speed of the first actor, a direction of movement of the first actor, or a turn signal status of the first actor.

6. The method of claim 1, further comprising:
identifying, in the selected scene, a second actor that was not a participant in the safety threshold violation; and
identifying a trajectory of the second actor over the time window,
wherein generating the set of simulated scenes also comprises generating simulated trajectories of the second actor in the selected scene.

7. The method of claim 1, wherein selecting the scene that includes a safety threshold violation comprises selecting a scene with a near-collision scenario by:
accessing a plurality of candidate scenes;
for each of the candidate scenes, analyzing movement of one or more objects on the scene to determine, for each object, a time-indexed location of the object over the time window of the scenes; and
classifying, as a near-collision scenario, any time segment during any of the candidate scenes in which an object came within a threshold time-to-collision from the vehicle whose perception system perceived the object.

8. The method of claim 1, wherein selecting the scene that includes a safety threshold violation comprises selecting a scene with a traffic law violation by:
accessing a plurality of candidate scenes; and
for each of the candidate scenes, analyzing the simulated trajectories to identify any simulated trajectories that correspond to a traffic law violation by the first actor.

9. The method of claim 1, wherein generating the simulated trajectories of the first actor in the selected scene comprises:
introducing one or more disturbances into the selected scene; and
predicting a trajectory that the first actor will take after each disturbance is introduced.

10. The method of claim 9, wherein introducing one or more disturbances into the selected scene comprises one or more of the following:
adding an occlusion into the selected scene;
varying size of one or more objects in the selected scene; or
changing a turn signal state on a vehicle in the selected scene.

11. The method of claim 1, wherein identifying the first actor that was a participant in the safety threshold violation also comprises determining that the first actor was relevant to one or more motion planning decisions of the autonomous vehicle by satisfying one or more of the following conditions when the first actor was a participant in the safety threshold violation:
the first actor was within a threshold distance from the autonomous vehicle;
the first actor was moving at or above a threshold speed; or
the first actor was moving in a direction that was toward the autonomous vehicle.

12. A system for identifying corner case simulation scenarios for an autonomous vehicle, the system comprising:
a processor;
a memory that stores a data store containing a plurality of scenes, in which each scene includes perception data corresponding to one or more actors as perceived over a time window by an autonomous vehicle perception system during a run of an autonomous vehicle during a time window in a real-world environment; and
a memory that stores computer-readable programming instructions that are configured to cause the processor to:
select, from the data store, a scene that includes a safety threshold violation,
identify, in the selected scene, a first actor that was a participant in the safety threshold violation,
identify a trajectory of the first actor over at least a portion of the time window;
generate a set of simulated scenes by generating simulated trajectories of the first actor in the selected scene, and
input one or more of the simulated scenes into an autonomous vehicle motion planning model to train an autonomous vehicle motion planning model.

13. The system of claim 12, further comprising additional programming instructions that are configured to cause the processor to:
analyze the simulated trajectories of the first actor to identify any of the simulated trajectories that correspond to one or more safety threshold violations;
identify a subset of the simulated scenes that include one or more of the safety threshold violations;
filter out simulated scenes that do not include any of the safety threshold violations; and
when training the autonomous vehicle motion planning model, do so with simulated scenes that include one or more of the safety threshold violation scenarios and not with any simulated scenes that were filtered out.

14. The system of claim 13, wherein the programming instructions to identify a subset of the simulated scenes that include one or more of the safety threshold violations comprises instructions to identify a subset of the simulated scenes that correspond to one or more identified extreme scenarios.

15. The system of claim 12, wherein the programming instructions to generate the simulated trajectories of the first actor in the selected scene comprise instructions to vary a time-indexed property of the first actor in the scene over the time window of the selected scene.

16. The system of claim 15, wherein the instructions to vary the time-indexed property of the first actor in the scene over the time window of the selected scene comprise instructions to apply a randomization function to randomly alter one or more of the following: a speed of the first actor, a direction of movement of the first actor, or a turn signal status of the first actor.

17. The system of claim 12, further comprising additional programming instructions that are configured to cause the processor to:
identify, in the selected scene, a second actor that was not a participant in the safety threshold violation; and
identify a trajectory of the second actor over the time window,
wherein the instructions to generate the set of simulated scenes also comprise instructions to generate simulated trajectories of the second actor in the selected scene.

18. The system of claim 12, wherein the instructions to select the scene that includes a safety threshold violation comprise instructions to select a scene with a near-collision scenario by:

accessing a plurality of candidate scenes;

for each of the candidate scenes, analyzing movement of one or more objects on the scene to determine, for each object, a time-indexed location of the object over the time window of the scenes; and classifying, as a near-collision scenario, any time segment during any of the candidate scenes in which an object came within a threshold time-to-collision from the vehicle whose perception system perceived the object.

19. The system of claim 12, wherein the instructions to select the scene that includes a safety threshold violation comprise instructions to select a scene with a traffic law violation by:

accessing a plurality of candidate scenes; and for each of the candidate scenes, analyzing the simulated trajectories to identify any simulated trajectories that correspond to a traffic law violation by the first actor.

20. The system of claim 12, wherein the instructions to generate the simulated trajectories of the first actor in the selected scene comprise instructions to:

introduce one or more disturbances into the selected scene; and predict a trajectory that the first actor will take after each disturbance is introduced.

21. The system of claim 20, wherein the instructions to introduce one or more disturbances into the selected scene comprise instructions to do one or more of the following:

add an occlusion into the selected scene;

vary size of one or more objects in the selected scene; or change a turn signal state on a vehicle in the selected scene.

22. The system of claim 12, wherein the instructions to identify the first actor that was a participant in the safety threshold violation also comprise instructions to determine that the first actor was relevant to one or more motion planning decisions of the autonomous vehicle by satisfying one or more of the following conditions when the first actor was a participant in the safety threshold violation:

the first actor was within a threshold distance from the autonomous vehicle;

the first actor was moving at or above a threshold speed; or the first actor was moving in a direction that was toward the autonomous vehicle.

\* \* \* \* \*